United States Patent
Todorow et al.

(10) Patent No.: US 8,299,391 B2
(45) Date of Patent: Oct. 30, 2012

(54) FIELD ENHANCED INDUCTIVELY COUPLED PLASMA (FE-ICP) REACTOR

(75) Inventors: Valentin N. Todorow, Palo Alto, CA (US); Samer Banna, San Jose, CA (US); Kartik Ramaswamy, San Jose, CA (US); Michael D. Willwerth, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1126 days.

(21) Appl. No.: 12/182,342

(22) Filed: Jul. 30, 2008

(65) Prior Publication Data
US 2010/0025384 A1 Feb. 4, 2010

(51) Int. Cl.
*B23K 10/00* (2006.01)
(52) U.S. Cl. ......... 219/121.54; 219/121.43; 156/345.44; 156/345.48; 118/723 I
(58) Field of Classification Search ............... 219/121.4, 219/121.41, 121.43, 121.44; 156/345.47, 156/345.44, 345, 48; 118/723 R, 723 I
See application file for complete search history.

(56) References Cited

U.S. PATENT DOCUMENTS

| | | | |
|---|---|---|---|
| 5,556,501 A | 9/1996 | Collins et al. | |
| 5,824,607 A | 10/1998 | Trow et al. | |
| 5,865,896 A | 2/1999 | Nowak et al. | |
| 6,177,646 B1 | 1/2001 | Okumura et al. | |
| 6,280,563 B1 | 8/2001 | Baldwin, Jr. et al. | |
| 6,447,636 B1 * | 9/2002 | Qian et al. ............... | 156/345.48 |
| 6,447,637 B1 | 9/2002 | Todorov et al. | |
| 6,719,886 B2 | 4/2004 | Drewery et al. | |
| 6,900,596 B2 * | 5/2005 | Yang et al. ............... | 315/111.21 |
| 7,517,437 B2 * | 4/2009 | Shamoun ................. | 204/298.08 |
| 7,740,739 B2 * | 6/2010 | Nishio et al. ............. | 156/345.51 |
| 8,012,306 B2 * | 9/2011 | Dhindsa ................... | 156/345.47 |
| 2002/0100557 A1 | 8/2002 | Li et al. | |
| 2004/0194890 A1 | 10/2004 | Moroz | |
| 2007/0181257 A1 | 8/2007 | Comendant et al. | |

FOREIGN PATENT DOCUMENTS
JP 06-196295 A 7/1994

OTHER PUBLICATIONS

International Search Report and Written Opinion mailed Feb. 24, 2010 for PCT Application No. PCT/US2009/050916.

* cited by examiner

*Primary Examiner* — Mark Paschall
(74) *Attorney, Agent, or Firm* — Moser Taboada; Alan Taboada

(57) ABSTRACT

Embodiments of field enhanced inductively coupled plasma reactors and methods of use of same are provided herein. In some embodiments, a field enhanced inductively coupled plasma processing system may include a process chamber having a dielectric lid and a plasma source assembly disposed above the dielectric lid. The plasma source assembly includes one or more coils configured to inductively couple RF energy into the process chamber to form and maintain a plasma therein, one or more electrodes configured to capacitively couple RF energy into the process chamber to form the plasma therein, wherein the one or more electrodes are electrically coupled to one of the one or more coils, and an RF generator coupled to the one or more inductive coils and the one or more electrodes. In some embodiments, a heater element may be disposed between the dielectric lid and the plasma source assembly.

20 Claims, 4 Drawing Sheets

FIELD ENHANCED INDUCTIVELY COUPLED PLASMA (FE-ICP) REACTOR

BACKGROUND

1. Field

Embodiments of the present invention generally relate to semiconductor processing equipment, and, more specifically, to inductively coupled plasma processing systems.

2. Description

Inductively coupled plasma (ICP) process reactors generally form plasmas by inducing current in a process gas disposed within the process chamber via one or more inductive coils disposed outside of the process chamber. The inductive coils may be disposed externally and separated electrically from the chamber by, for example, a dielectric lid. For some plasma processes, a heater element may be disposed above the dielectric lid to facilitate maintaining a constant temperature in the chamber during and between processes.

The heater may be an open break heater (e.g., a non closed electrical loop) or a no break heater (e.g., a closed electrical loop). In embodiments where the heater element is an open break heater element, the heater element introduces plasma non-uniformity that can result, for example, in non-uniform etch rates of a substrate being processed or asymmetry in the etch pattern. This plasma non-uniformity can be eliminated by replacing the open break heater element with a no break heater element. However, in embodiments where the heater element is a no break heater element, RF energy delivered to the inductive coils also inductively couple to the no break heater element, thereby undesirably reducing the energy available to form a plasma within the process chamber (e.g., the no break heater element reduces the plasma strike window).

Thus, there is a need for an improved inductively coupled plasma reactor.

SUMMARY

Embodiments of field enhanced inductively coupled plasma reactors and methods of use of same are provided herein. In some embodiments, a field enhanced inductively coupled plasma processing system may include a process chamber having a dielectric lid and a plasma source assembly disposed above the dielectric lid. The plasma source assembly includes one or more coils configured to inductively couple RF energy into the process chamber to form and maintain a plasma therein, one or more electrodes configured to capacitively couple RF energy into the process chamber to form the plasma therein, wherein the one or more electrodes are electrically coupled to one of the one or more coils, and an RF generator coupled to the one or more inductive coils and the one or more electrodes. In some embodiments, a heater element may be disposed between the dielectric lid and the plasma source assembly, In some embodiments, a method of forming a plasma may include providing a process gas to an inner volume of a process chamber having a dielectric lid and having one or more coils and one or more electrodes disposed above the lid, wherein the one or more electrodes are electrically coupled to one of the one or more coils. RF power is provided to the one or more coils and one or more electrodes from an RF power source. A plasma is formed from the process gas using the RF power provided by the RF power source that is inductively and capacitively coupled to the process gas by the one or more coils and one or more electrodes, respectively.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
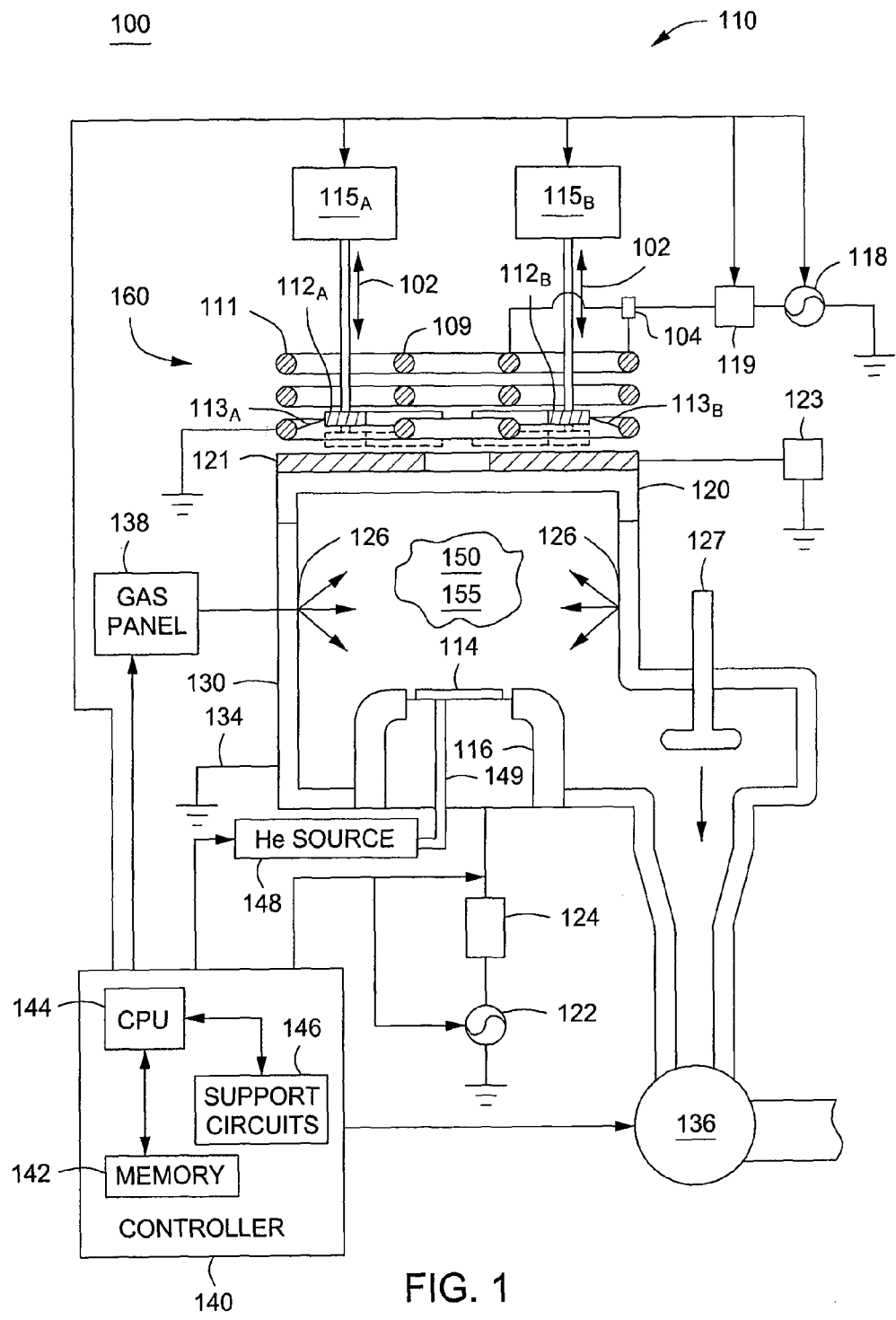
FIG. 1 depicts a schematic side view of a field enhanced inductively coupled plasma reactor in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of field enhanced inductively coupled plasma reactors and methods of use of same are provided herein. The inventive inductively coupled plasma reactors may advantageously provide increased radio frequency (RF) energy available for striking a plasma (e.g., an increased or enhanced plasma striking window). In addition, the inventive inductively coupled plasma reactors may advantageously provide excellent plasma strike capabilities without substantially altering the uniformity, density, or other desirable characteristics of the plasma.

FIG. 1 depicts a schematic side view of a field enhanced inductively coupled plasma reactor (reactor 100) in accordance with some embodiments of the present invention. The reactor 100 may be utilized alone or, as a processing module of an integrated semiconductor substrate processing system, or cluster tool, such as a CENTURA® integrated semiconductor wafer processing system, available from Applied Materials, Inc. of Santa Clara, Calif. Examples of suitable plasma reactors that may advantageously benefit from modification in accordance with embodiments of the present invention include inductively coupled plasma etch reactors such as the DPS® line of semiconductor equipment (such as the DPS®, DPS® II, DPS® AE, DPS® G3 poly etcher, DPS® G5, or the like) also available from Applied Materials, Inc. The above listing of semiconductor equipment is illustrative only, and other etch reactors, and non-etch equipment (such as CVD reactors, or other semiconductor processing equipment) may also be suitably modified in accordance with the present teachings.

The reactor 100 generally includes a process chamber 110 having a conductive body (wall) 130 and a dielectric lid 120 (that together define a processing volume), a substrate support pedestal 116 disposed within the processing volume, a plasma source assembly 160, and a controller 140. The wall 130 is typically coupled to an electrical ground 134. In some embodiments, the support pedestal (cathode) 116 may be coupled, through a first matching network 124, to a biasing power source 122. The biasing source 122 may illustratively be a source of up to 1000 W at a frequency of approximately 13.56 MHz that is capable of producing either continuous or pulsed power, although other frequencies and powers may be provided as desired for particular applications. In other embodiments, the source 122 may be a DC or pulsed DC source.

In some embodiments, the dielectric lid 120 may be substantially flat. Other modifications of the chamber 110 may have other types of lids such as, for example, a dome-shaped lid or other shapes. The plasma source assembly 160 is typically disposed above the lid 120 and is configured to inductively coupling RF power into the process chamber 110. The plasma source assembly 160 includes one or more inductive coils, one or more electrodes, and a plasma power source. The one or more inductive coils may be disposed above the dielectric lid 120. As shown in FIG. 1, two coils are illustratively shown (an inner coil 109 and an outer coil 111) disposed above the lid 120. Where multiple coils are provided, the coils may be concentrically arranged, for example, having the inner coil 109 disposed within the outer coil 111. The relative position, ratio of diameters of each coil, and/or the number of turns in each coil can each be adjusted as desired to control, for example, the profile or density of the plasma being formed. Each coil of the one or more inductive coils (e.g., coils 109, 111 as shown in FIG. 1) is coupled, through a second matching network 119, to a plasma power source 118. The plasma source 118 may illustratively be capable of producing up to 4000 W at a tunable frequency in a range from 50 kHz to 13.56 MHz, although other frequencies and powers may be provided as desired for particular applications.

In some embodiments, a power divider, such as a dividing capacitor, may be provided between the coils of the one or more inductive coils to control the relative quantity of RF power provided by the plasma power source 118 to the respective coils. For example, as shown in FIG. 1, a power divider 104 may be disposed in the line coupling the inner coil 109 and the outer coil 111 to the plasma power source 118 for controlling the amount of RF power provided to each coil (thereby facilitating control of plasma characteristics in zones corresponding to the inner and outer coils).

The one or more electrodes are electrically coupled to one of the one or more inductive coils (e.g., as depicted in FIG. 1, either the inner coil 109 or the outer coil 111). In one exemplary non-limiting embodiment, and as illustrated in FIG. 1, the one or more electrodes of the plasma source assembly 160 may be two electrodes $112_A$, $112_B$ disposed between the inner coil 109 and the outer coil 111 and proximate the dielectric lid 120. Each electrode $112_A$, $112_B$ may be electrically coupled to either the inner coil 109 or the outer coil 111. As depicted in FIG. 1, each electrode $112_A$, $112_B$ is coupled to the outer coil 111 via respective electrical connectors $113_A$, $113_B$. RF power may be provided to the one or more electrodes via the plasma power source 118 via the inductive coil to which they are coupled (e.g., the inner coil 109 or the outer coil 111 in FIG. 1).

In some embodiments, the one or more electrodes may be movably coupled to one of the one or more inductive coils to facilitate the relative positioning of the one or more electrodes with respect to the dielectric lid 120 and/or with respect to each other. For example, one or more positioning mechanisms may be coupled to one or more of the at least one electrodes to control the position thereof. The positioning mechanisms may be any suitable device, manual or automated, that can facilitate the positioning of the one or more electrodes as desired, such as devices including lead screws, linear bearings, stepper motors, wedges, or the like. The electrical connectors coupling the one or more electrodes to a particular inductive coil may be flexible to facilitate such relative movement. For example, in some embodiments, the electrical connector may include one or more flexible mechanisms, such as a braided wire or other conductor.

Figure 4A:
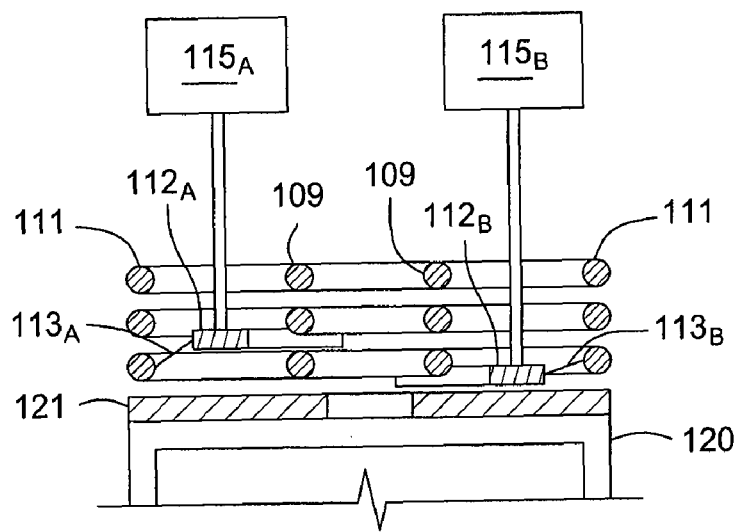
FIGS. 4A-B respectively depict schematic views of various configurations of a plasma source assembly of the field enhanced inductively coupled plasma reactor of FIG. 1 in accordance with some embodiments of the present invention.
Figure 4B:
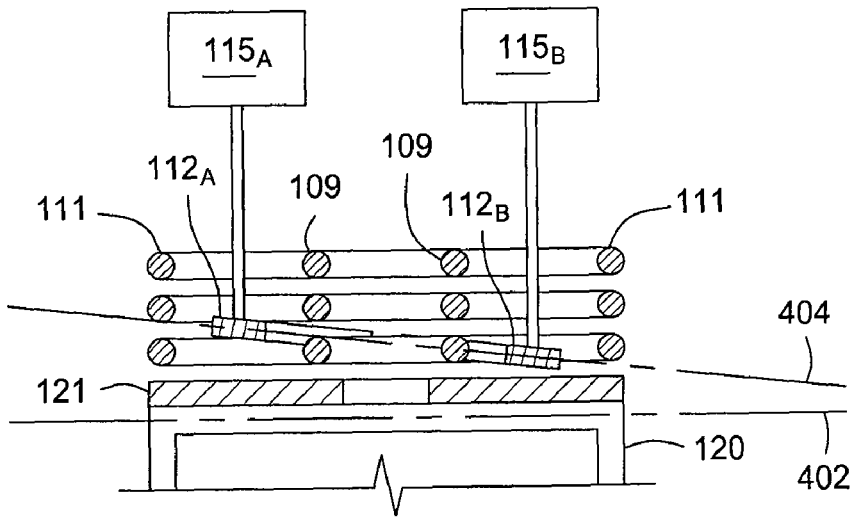

In some embodiments, and as depicted in FIG. 1, positioning mechanisms $115_A$, $115_B$ may be coupled to each of the electrodes (e.g., electrodes $112_A$, $112_B$) to independently control the position and orientation thereof (as indicated by vertical arrows 102 and the phantom extension of the electrodes $112_A$, $112_B$). In some embodiments, the positioning mechanism(s) may independently control the vertical position of each electrode of the one or more electrodes. For example, as depicted in FIG. 4A, the position of electrode $112_A$ may be controlled by positioning mechanism $115_A$ independently of the position of electrode $112_B$, as controlled by positioning mechanism $115_B$. In addition, the positioning mechanisms $115_A$, $115_B$ may further control the angle, or tilt of the electrodes (or an electrode plane defined by the one or more electrodes). For example, as shown in FIG. 4B, the angle of a plane 404 defined by the electrodes $112_A$, $112_B$ may be controlled relative to a reference plane 402 (for example, parallel to the chamber lid 120) by one or both of positioning mechanisms $115_A$, $115_B$. Alternatively, a separate mechanism (not shown) may be provided to control the tilt of the electrodes. Independent control over the vertical position of one electrode relative to the other electrodes, and/or control of the tilt or angle of the electrode plane, facilitates the relative quantity of capacitive coupling provided by the electrodes (e.g., more capacitive coupling by portions of the electrodes disposed closer to the processing volume of the process chamber and less capacitive coupling by portions of the electrodes disposed further from the processing volume of the process chamber).

For example, in some embodiments, the electrodes may be positioned proximate a base of the coils and in a plane substantially parallel to the dielectric lid 120 as shown in FIG. 1, thereby increasing the capacitive coupling provided by the electrodes. Other configurations of the electrodes are possible such as having the electrodes disposed at different vertical distances and/or different angles with respect to the dielectric lid 120 and each other. Control over the quantity of capacitive coupling of RF power provided by the one or more electrodes of the plasma source assembly 160 facilitates controlling the plasma characteristics within the chamber. For example, the increased capacitive coupling provided by the one or more electrodes of the plasma source assembly 160 increases the plasma strike window (enhances the capability to strike a plasma over a wider range of processing conditions) while maintaining the desirable characteristics of an inductively coupled plasma. Selective control over the position of the one or more electrodes allows for just enough capacitive coupling to facilitate striking the plasma without coupling too much RF energy into the plasma once formed, thereby undesirably altering its characteristics (e.g., density, dissociation fraction, ion/neutral ratio, or the like). Moreover, control over the relative position or tilt of the one or more electrodes further facilitates compensating for process effects that may otherwise lead to a non-uniform plasma (such as non-uniform gas velocities in the chamber due to asymmetric gas deliver and/or pumping). For example, by increasing the capacitive coupling in regions of low plasma density relative to regions of higher plasma density, the overall plasma distribution within the chamber may be made more uniform, thereby facilitating more uniform processing.

The one or more electrodes of the plasma source assembly 160 may be symmetrically arranged atop the dielectric lid 120 to promote uniform coupling of RF energy to the plasma. In some embodiments, the one or more electrode is configured to not provide a continuous path that may cause current to be induced within the one or more electrodes. Accordingly, in embodiments where a single electrode is utilized, the electrode may include a dielectric break such that the electrode does not form a conductive annular ring. However, such a singular break may lead to plasma non-uniformities due to asymmetry of the configuration. In embodiments where a single electrode is utilized, the dielectric break in the electrode may be positioned to compensate for a natural plasma distribution in chamber, such as to correspond with a region of relatively higher plasma density or proximate a pump port of the chamber.

Figure 2A:
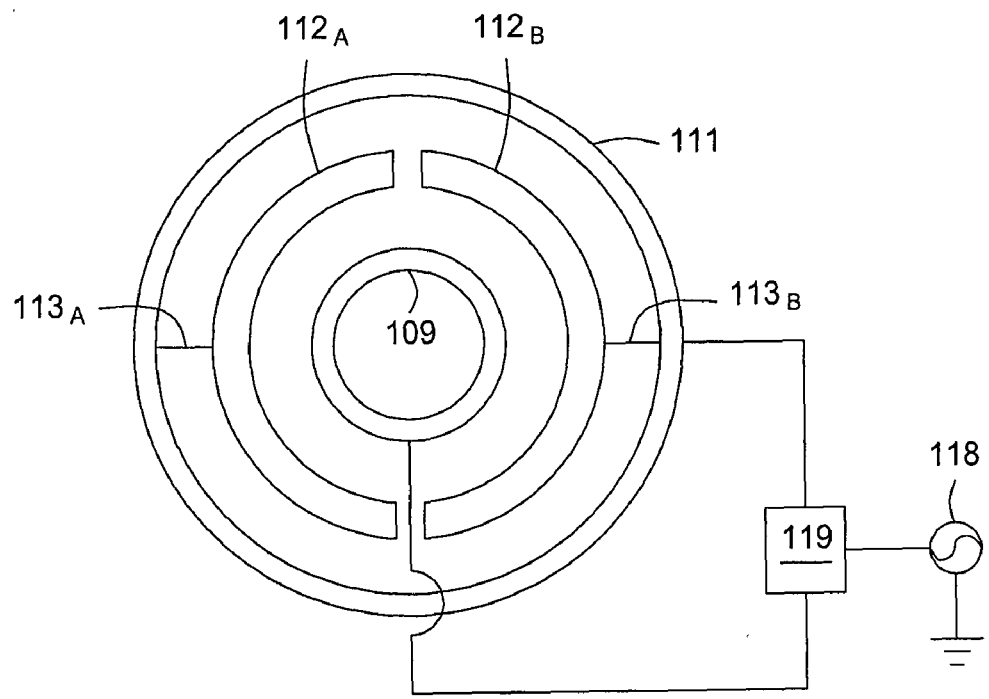
FIG. 2A-B depict schematic top views of coils and electrodes of a field enhanced inductively coupled plasma reactor in accordance with some embodiments of the present invention.

In some embodiments, at least two electrodes are utilized to symmetrically distribute any plasma affects caused by the dielectric space between the electrodes. For example, FIG. 2A depicts a schematic top view of one exemplary embodiment of the reactor 100 having two arcuate electrodes $112_A$, $112_B$ substantially equidistantly spaced from each other and disposed between the inner coil 109 and the outer coil 111. The surface area of the electrodes factors into the control over the capacitive coupling provided by the electrodes. As such, the electrodes may be planar or substantially planar. In some embodiments, the electrodes may have an arc length and a width suitable to fit between the inductive coils and to maintain a dielectric space between the electrodes. The width may be selected accordingly for the purposes of defining the surface area of each electrode, and thus the degree of RF energy that can be capacitively coupled into the process chamber 110.

Figure 2B:
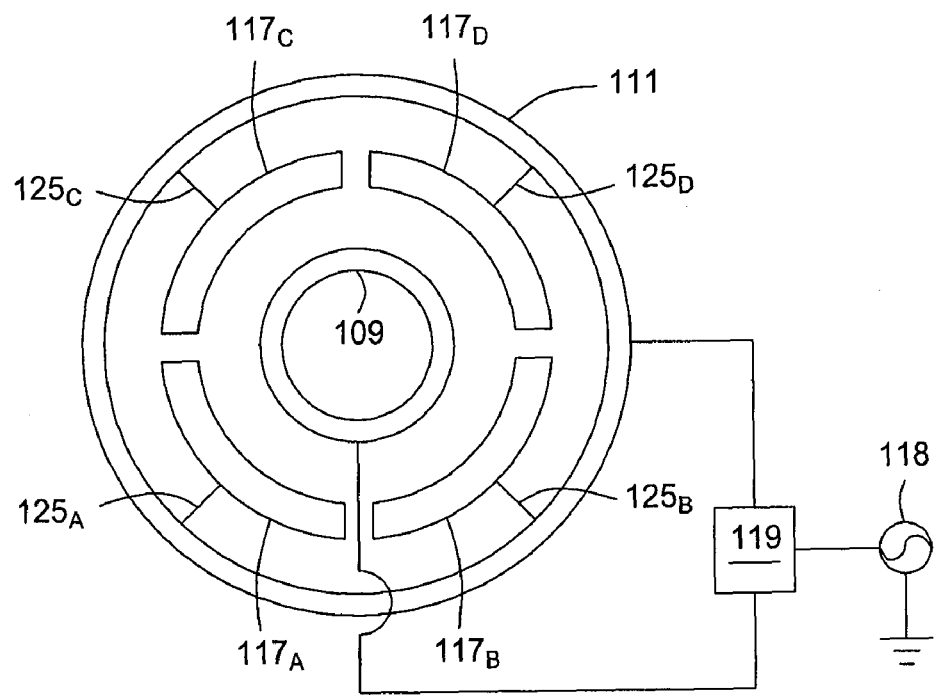

Although shown as a pair of electrodes in FIGS. 1 and 2A, other quantities and shapes of the electrodes are possible, such as, three, four, or more. For example, as shown in FIG. 2B, four quarter ring-shaped electrodes $117_A$, $117_B$, $117_C$, $117_D$ may be provided to substantially surround the inner coil 109 along the circumference thereof. The four quarter ring electrodes may be substantially equidistantly spaced from each other and may be disposed between the inner coil 109 and the outer coil 111. Each electrode $117_{A-D}$ may be coupled to the outer coil 111 (or the inner coil 109) via a respective electrical connector $125_{A-D}$. The electrical connectors $125_{A-D}$ may be substantially equivalent to the electrical connectors 113A-B discussed below with respect to FIG. 1.

Returning to FIG. 1, a heater element 121 may be disposed atop the dielectric lid 120 to facilitate heating the interior of the process chamber 110. The heater element 121 may be disposed between the dielectric lid 120 and the inductive coils 109, 111 and electrodes $112_{A-B}$. In some embodiments, the heater element 121 may include a resistive heating element and may be coupled to a power supply 123, such as an AC power supply, configured to provide sufficient energy to control the temperature of the heater element 121 to be between about 50 to about 100 degrees Celsius. In some embodiments, the heater element 121 may be an open break heater. In some embodiments, the heater element 121 may comprise a no break heater, such as an annular element, thereby facilitating uniform plasma formation within the process chamber 110.

Figure 3:
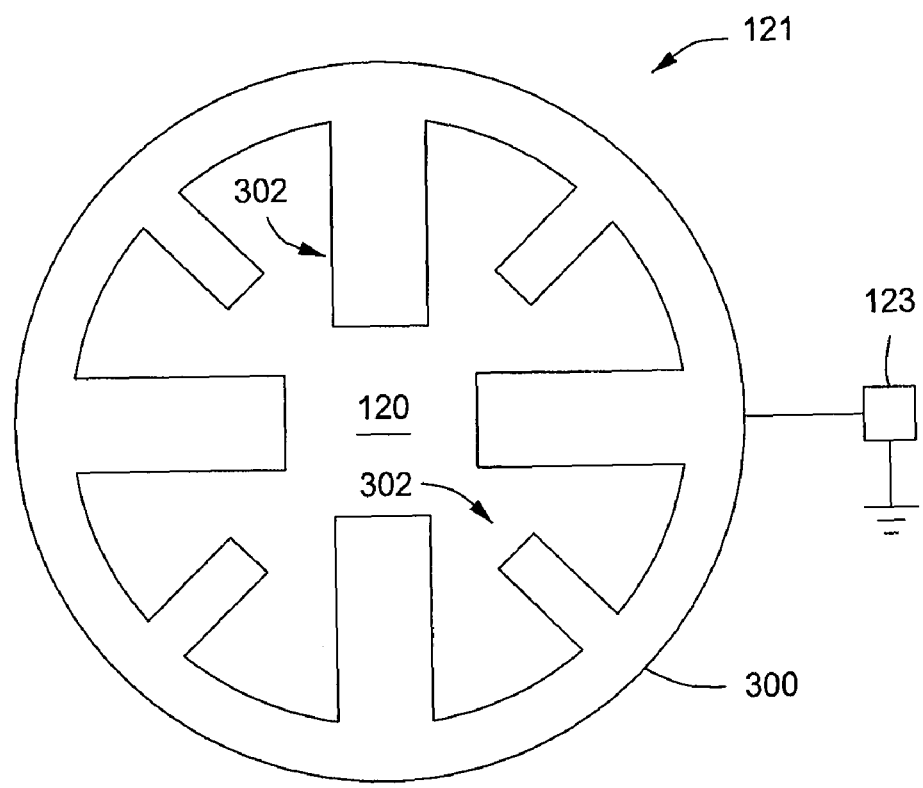
FIG. 3 depicts a schematic top view of a heater element of a field enhanced inductively coupled plasma reactor in accordance with some embodiments of the present invention.

For example, FIG. 3 depicts a plan view of a heater element 121 in accordance with some embodiments of the present invention. The heater element 121 may include an annular portion 300 having fins 302 extending inwardly therefrom. In some embodiments, the annular portion 300 may be disposed along the periphery of the dielectric lid 120 as shown in FIGS. 1 and 3 (e.g., the annular portion 300 may have an outer diameter that is substantially equal to the outer diameter of the dielectric lid 120). In some embodiments, the annular portion 300 may have an outer diameter that is either greater than or less than that of the dielectric lid 120. Other suitable configurations of the annular portion 300 may be utilized that allow for substantially uniform heating of the dielectric lid 120. The fins 302 may be of any suitable width, length, number, and/or position about the annular portion 300 to provide a desired quantity and distribution of heat to the process chamber 110. As illustrated in FIG. 3, the fins 302 may be arranged symmetrically about the annular portion 300 of the heater element 121 and may extend radially inward therefrom.

Returning to FIG. 1, during operation, a substrate 114 (such as a semiconductor wafer or other substrate suitable for plasma processing) may be placed on the pedestal 116 and process gases may be supplied from a gas panel 138 through entry ports 126 to form a gaseous mixture 350 within the process chamber 110. The gaseous mixture 150 may be ignited into a plasma 155 in the process chamber 110 by applying power from the plasma source 118 to the inductive coils 109, 111 and the one or more electrodes (e.g., $112_A$ and $112_B$), as discussed in more detail below with respect to FIG. 5. In some embodiments, power from the bias source 122 may be also provided to the pedestal 116. The pressure within the interior of the chamber 110 may be controlled using a throttle valve 127 and a vacuum pump 136. The temperature of the chamber wall 130 may be controlled using liquid-containing conduits (not shown) that run through the wall 130.

The temperature of the wafer 114 may be controlled by stabilizing a temperature of the support pedestal 116. In one embodiment, helium gas from a gas source 148 may be provided via a gas conduit 149 to channels defined between the backside of the wafer 114 and grooves (not shown) disposed in the pedestal surface. The helium gas is used to facilitate heat transfer between the pedestal 116 and the wafer 114. During processing, the pedestal 116 may be heated by a resistive heater (not shown) within the pedestal to a steady state temperature and the helium gas may facilitate uniform heating of the wafer 114. Using such thermal control, the wafer 114 may illustratively be maintained at a temperature of between 0 and 500 degrees Celsius.

The controller 140 comprises a central processing unit (CPU) 144, a memory 142, and support circuits 146 for the CPU 144 and facilitates control of the components of the reactor 100 and, as such, of methods of forming a plasma, such as discussed herein. The controller 140 may be one of any form of general-purpose computer processor that can be used in an industrial setting for controlling various chambers and sub-processors. The memory, or computer-readable medium, 142 of the CPU 144 may be one or more of readily available memory such as random access memory (RAM), read only memory (ROM), floppy disk, hard disk, or any other form of digital storage, local or remote. The support circuits 146 are coupled to the CPU 144 for supporting the processor in a conventional manner. These circuits include cache, power supplies, clock circuits, input/output circuitry and subsystems, and the like. The inventive method may be stored in the memory 142 as software routine that may be executed or invoked to control the operation of the reactor 100 in the manner described above. The software routine may also be stored and/or executed by a second CPU (not shown) that is remotely located from the hardware being controlled by the CPU 144.

Figure 5:
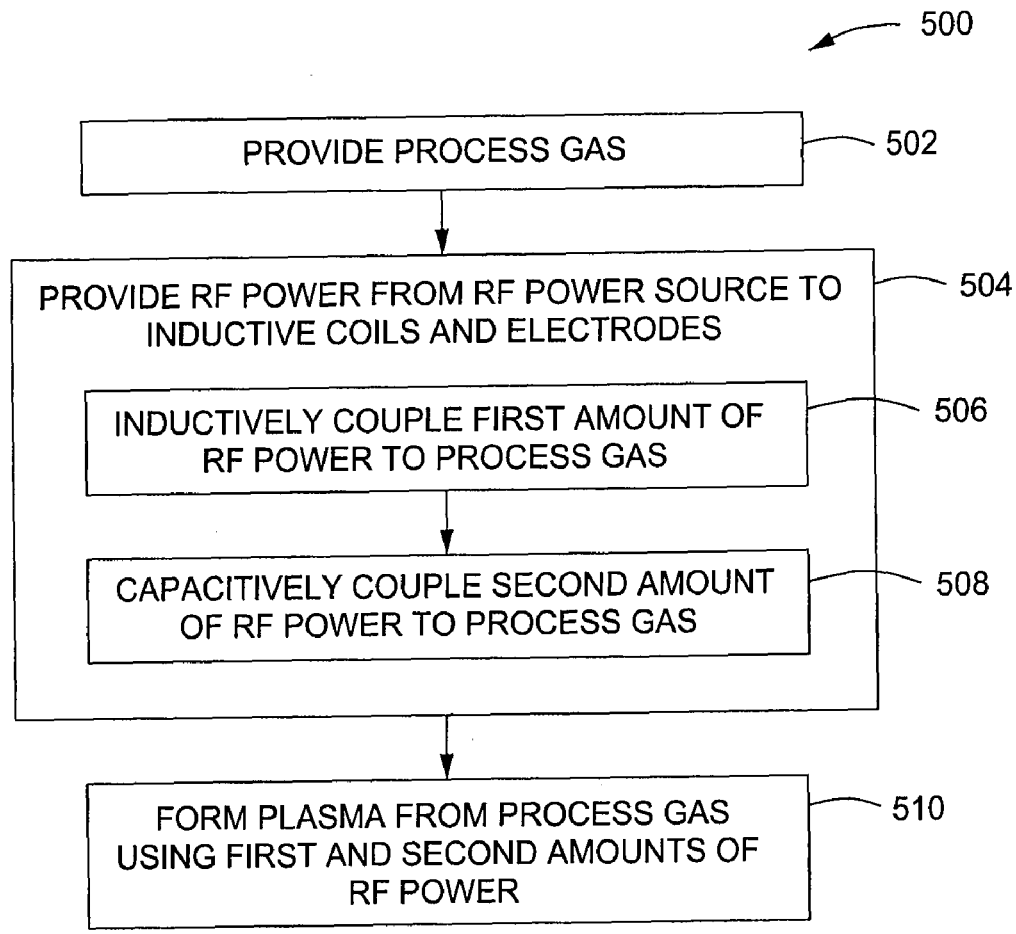
FIG. 5 depicts a flow chart for a method of forming a plasma in accordance with some embodiments of the invention.

FIG. 5 depicts a method 500 of forming a plasma in a field enhanced inductively coupled reactor, similar to the reactor 100 described above, in accordance with some embodiments of the present invention. The method generally begins at 502, where a process gas (or gases) is provided to the process chamber 110. The process gas or gases may be supplied from the gas panel 138 through the entry ports 126 and form the gaseous mixture 150 in the chamber 110. The chamber components, such as the wall 130, the dielectric lid 120, and the support pedestal 116, may be heated as described above to a desired temperature before or after the process gases are provided. The dielectric lid 120 may be heated by supplying power from the power source 123 to the heater element 121. The power supplied may be controlled to maintain the process chamber 110 at a desired temperature during processing.

Next, at 504, RF power from the RF power source 118 may be provided to the one or more inductive coils and the one or more electrodes to be respectively inductively and capacitively coupled to the process gas mixture 150. The RF power may illustratively be provided at up to 4000 W and at a tunable frequency in a range from 50 kHz to 13.56 MHz, although other powers and frequencies may be utilized to form the plasma. The RF power is simultaneously provided to both the one or more inductive coils and the one or more electrodes as the one or more electrodes are electrically coupled to one of the one or more inductive coils.

In some embodiments, a first amount of RF power may be inductively coupled to the process gas via the one or more inductive coils, as shown at 506. The first amount of RF power may be undesirably reduced by the presence of a no break heating element (e.g., embodiments where heater element 121 is a no break heating element) due to a portion of the first amount of RF power being inductively coupled into the heater element 121, thereby undesirably making it more difficult to strike a plasma. However, a second amount of RF power is capacitively coupled to the process gas via the electrodes $112_{A-B}$, as shown at 508. As the second amount of RF power is capacitively coupled into the process gas and is not reduced by inductive coupling to the heater element 121, the second amount of RF power improves the ability to strike a plasma under a much wider range of conditions.

The second amount of RF power capacitively coupled to the process gas may be controlled, for example, by increasing (to reduce capacitive coupling) or decreasing (to increase capacitive coupling) the distance between each electrode (e.g., electrodes $112_A$, $112_B$) and the dielectric lid 120. As discussed above, the position of the one or more electrodes may be controlled independently such that the electrodes may be equally or unequally spaced from the dielectric lid, The distance between each electrode and the heater element 121 may also be controlled to prevent arcing therebetween.

The second amount of RF power capacitively coupled to the process gas may also be controlled, for example, controlling the tilt, or angle, between the electrode plane (e.g., the bottom of the electrodes $112_A$, $112_B$) and the dielectric lid 120. The planar orientation of the one or more electrodes (e.g., electrodes $112_A$, $112_B$) may be controlled to facilitate adjusting the second amount of RF power capacitively coupled to the process gas mixture 150 in certain regions of the process chamber 110 (e.g., as the electrode plane is tilted, some portions of the one or more electrodes will be closer to the dielectric lid 120 than other portions).

At 510, the plasma 155 is formed from the process gas mixture 150 using the first and second amounts of RF power provided by the inductive coils 109, 111 and the electrodes $112_{A-B}$, respectively. Upon striking the plasma, and obtaining plasma stabilization, the method 500 generally ends and plasma processing may continue as desired. For example, the process may continue, at least in part, using the RF power settings and other processing parameters per a standard process recipe. Alternatively or in combination, the one or more electrodes may be moved further away from the dielectric lid 120 to reduce the capacitive coupling of RF power into the process chamber 110 during the process. Alternatively or in combination, the one or more electrodes may be moved closer to the dielectric lid 120, or may be tilted at an angle to increase the capacitive coupling of RF power into the process chamber 110 or to control the relative quantity of RF power capacitively coupled into regions of the process chamber 110.

Thus, a field enhanced inductively coupled plasma reactor and methods of use have been provided herein. The field enhanced inductively coupled plasma reactor of the present invention may advantageously improve the available RF power for striking a plasma within the chamber without altering other plasma characteristics, such plasma uniformity or ion density. The field enhanced integrated plasma reactor of the present invention may further advantageously control, and/or adjust, plasma characteristics such as uniformity and/or density during processing.

While the foregoing is directed to embodiments of the present invention, other and further embodiments of the invention may be devised without departing from the basic scope thereof, and the scope thereof is determined by the claims that follow.

The invention claimed is:

1. A field enhanced inductively coupled plasma processing system, comprising:
   a process chamber having a dielectric lid;
   a plasma source assembly disposed above the dielectric lid, the plasma source assembly comprising:
      one or more coils configured to inductively couple RF energy into the process chamber to form and maintain a plasma therein;
      one or more electrodes configured to capacitively couple RF energy into the process chamber to form the plasma therein, wherein the one or more electrodes are electrically coupled to one of the one or more coils via an electrical connector; and
      an RF generator coupled to the one or more inductive coils and the one or more electrodes.

2. The system of claim 1, wherein the one or more coils further comprise:
   an outer coil; and
   an inner coil.

3. The system of claim 2, wherein the one or more electrodes further comprise:
   two electrodes equidistantly spaced apart and disposed between the inner coil and the outer coil, wherein each electrode is electrically coupled to the outer coil.

4. The system of claim 2, wherein the one or more electrodes further comprise:
   four quarter ring-shaped electrodes equidistantly spaced apart and disposed between the inner coil and the outer coil, wherein each electrode is electrically coupled to the outer coil.

5. The system of claim 1, further comprising:
   one or more position control mechanisms coupled to the one or more electrodes for independently controlling a perpendicular distance defined between the dielectric lid and the one or more electrodes.

6. The system of claim 1, wherein the angle of an electrode plane defined by the one or more electrodes relative to the dielectric lid is adjustable.

7. The system of claim 1, further comprising:
a heater element disposed between the dielectric lid and the one or more electrodes of the plasma source assembly.

8. The system of claim 7, further comprising:
an AC power supply coupled to the heater element.

9. The system of claim 7, wherein the heater element is a no break heater element.

10. The system of claim 1, further comprising:
a support pedestal disposed within the process chamber having a bias power source coupled thereto.

11. The system of claim 1, wherein the one or more electrodes further comprise:
two electrodes equidistantly spaced apart.

12. A method of forming a plasma, comprising:
providing a process gas to an inner volume of a process chamber having a dielectric lid and having one or more coils and one or more electrodes disposed above the lid, wherein the one or more electrodes are electrically coupled to one of the one or more coils;
providing RF power to the one or more coils and one or more electrodes from an RF power source by inductively coupling a first amount of RF power from an RF power source to the process gas via the one or more coils and capacitively coupling a second amount of RF power from the RF power source to the process gas via the one or more electrodes; and
forming a plasma from the process gas using the RF power provided by the RF power source that is inductively and capacitively coupled to the process gas by the one or more coils and one or more electrodes, respectively.

13. The method of claim 12, further comprising:
controlling the second amount of RF power from the RF power source capacitively coupled to the process gas by adjusting a perpendicular distance between the one or more electrodes and the lid.

14. The method of claim 12, the process chamber further comprising a no break heater element disposed atop the lid.

15. The method of claim 14, further comprising:
supplying power to the heater element from an AC power supply to control a temperature of the process chamber.

16. The method of claim 12, further comprising:
adjusting a perpendicular distance between at least one of the one or more electrodes and the lid.

17. The method of claim 12, further comprising:
adjusting a perpendicular distance between each of the one or more electrodes and the lid.

18. The method of claim 17, wherein the perpendicular distance between each of the one or more electrodes and the lid is different for each electrode.

19. The method of claim 12, further comprising:
adjusting the angle of an electrode plane defined by the one or more electrodes relative to the dielectric lid.

20. The method of claim 12, further comprising:
adjusting a perpendicular distance between each of the one or more electrodes and the lid or adjusting the angle of an electrode plane defined by the one or more electrodes relative to the dielectric lid to control at least one of plasma uniformity or ion density.

* * * * *